United States Patent [19]
Khasin et al.

[11] Patent Number: 6,012,658
[45] Date of Patent: Jan. 11, 2000

[54] METHOD OF PRODUCING METAL FLAKES, PARTICULARLY SILVER FLAKES OF HIGH PURITY

[75] Inventors: Ernst Khasin, Rishon Lezion; Abraham Greenboim, Ra'anana, both of Israel

[73] Assignee: Nanopowders Industries Ltd, Kfar Saba, Israel

[21] Appl. No.: 09/158,004

[22] Filed: Sep. 22, 1998

[51] Int. Cl.⁷ .................................................. B02C 19/12
[52] U.S. Cl. ................................... 241/5; 75/356; 241/21
[58] Field of Search ............................ 75/343, 345, 354, 75/356; 241/5, 39, 15, 29, 21

[56] References Cited

U.S. PATENT DOCUMENTS

| | | | |
|---|---|---|---|
| 3,941,584 | 3/1976 | Tundermann et al. | 75/343 |
| 4,486,225 | 12/1984 | Osborn et al. | 241/15 |
| 5,476,535 | 12/1995 | Khasin | 75/345 |

*Primary Examiner*—Mark Rosenbaum
*Attorney, Agent, or Firm*—Benjamin J. Barish

[57] ABSTRACT

A method of producing metal flakes by producing a highly porous sponge structure of the metal; comminuting the highly porous sponge structure into particles; and flattening the particles into flakes having a low porosity. The method is particularly useful for producing high-purity flakes of silver, including its alloys.

20 Claims, 1 Drawing Sheet

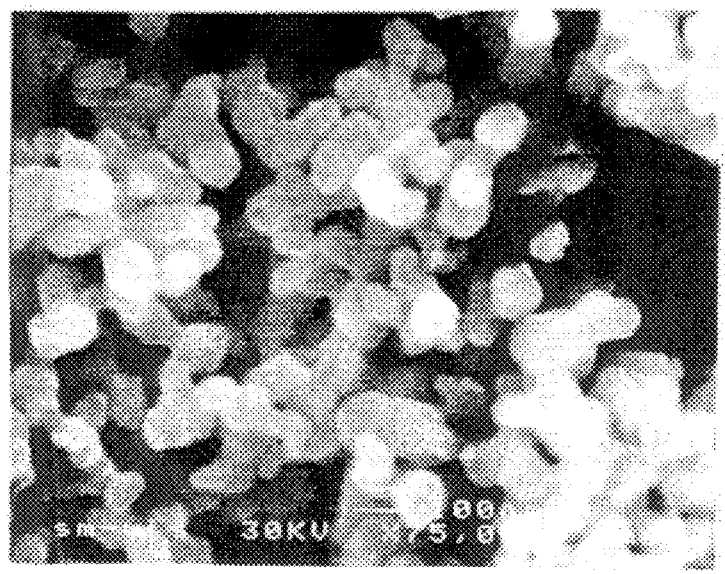
FIG. 1 (x 75,000)
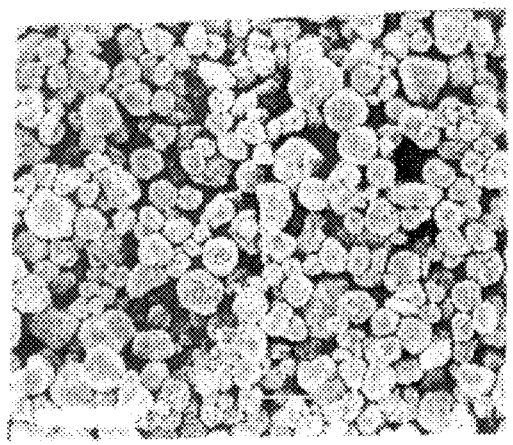
FIG. 2 (x 1,000)
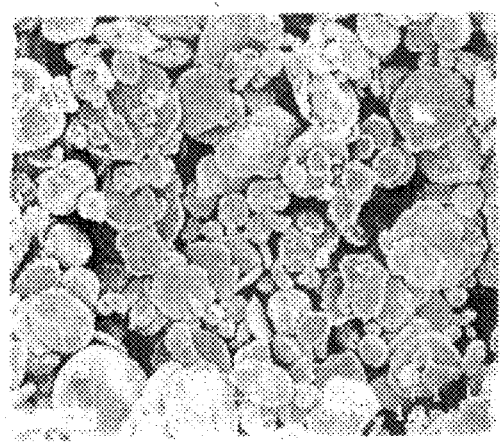
FIG. 3 (x 1,000)

METHOD OF PRODUCING METAL FLAKES, PARTICULARLY SILVER FLAKES OF HIGH PURITY

FIELD AND BACKGROUND OF THE INVENTION

The present invention relates to a method of producing metal flakes. The invention is particularly useful for producing flakes of silver (which term as used herein, includes its alloys) having high purity, and is therefore described below with respect to this application.

Silver flakes are used in a wide variety of applications, particularly in the electronics industry for producing conductive adhesives, conductive polymers, thick films, shielding materials, printing inks, and the like. Silver flakes are generally produced by mechanically milling silver powders obtained according to various techniques, such as chemical precipitation, electrolyitc deposition, melt atomising, and salt or oxide decomposition. However, silver particles produced according to these techniques are practically of a non-porous structure, and therefore require a considerable amount of energy for deforming them into the flat flakes. Such a flattening operation is usually performed by mechanical milling which may take up to about 40 hours.

Moreover, such mechanical milling generally requires an organic lubricant, surfactant, or other organic material in order to prevent co-welding between the particles. As a result, a large amount of residual organic material remains on the flake surfaces. Such a residual material is extremely difficult, if possible at all, to completely remove because it is chemically absorbed on the silver surface. This residual organic material decreases the electrical conductivity of the silver flakes, and therefore degrades them for many uses in the electronic field where high electrical conductivity is needed.

OBJECTS AND BRIEF SUMMARY OF THE INVENTION

An object of the present invention is to provide a method of producing metal flakes having advantages in the above respects. More particularly, an object of the present invention is to provide a method of producing metal flakes which does not require a difficult-to-remove organic lubricant, surfactant, or other organic material to prevent co-welding between the particles. A further object of the invention is to provide a method which requires a significantly shorter period of time than the above-discussed conventional methods. A further object of the invention is to provide a method of producing metal flakes particularly useful for producing high purity flakes of silver or its alloys.

According to a broad aspect of the present invention, there is provided a method of producing metal flakes comprising the following operations: (a) producing a highly porous sponge structure of the metal; (b) comminuting the highly porous sponge structure into particles; and (c) flattening the particles into flakes having a low porosity, the flattening operation being performed in a medium free of an organic lubricant.

The porosity of the highly porous sponge structure produced in operation (a) is preferably as high as possble while avoiding disintegration of the sponge structure and maintaining its physical integrity. Preferably, the porosity should be greater than 30%; particularly good results have been obtained when it was from 40–65%.

By first producing the highly porous sponge structure of the metal and then comminuting the sponge structure into particles, the particles so produced also have a high porosity. Therefore, the flattening operation (c) not only can be performed in a much shorter period of time than in the conventional process, but also does not require, to prevent co-welding of the particles, an organic lubricant, surfactant, or other liquid which would be difficult to remove from the produced metal flakes. In the preferred embodiment described below, the flattening operation (c) is performed by grinding the particles, preferably in a ball mill, while the particles are in an aquous medium free of any difficult-to-remove organic lubricant or surfactant.

A further important advantage in the method of the present invention is that the flattening operation (c) may be such as not to break down the comminuted particles produced in operation (b), so that the size of the flakes produced in the flattening operation (c) may be controlled by controlling the size of the comminuted particles produced in operation (b).

According to further features in the described preferred embodiment, the comminuting operation (b) comminutes the highly porous sponge structure into particles having an average size of 0.5 to 20 microns. Particularly good results have been obtained when the comminuting operation is performed in an air jet mill which produces rounded particles, sometimes called "potatoe-shaped" particles.

If the comminuted particles produced in operation (b) are not sufficiently robust (i.e., tend to easily disintegrate) for the flattening operation (c), the particles may be strengthened by sintering them before being flattened in operation (c). The sintering may be performed at an elevated temperature in air, vacuum, or liquid.

Particularly good results have been obtained when the highly porous sponge structure produced in operation (a) is in the form of agglomerates having an average size of over 1 mm, an internal porosity of 40–60%, and an average internal pore size of 20–50 nm. Such a highly porous sponge structure may be produced according to the method described in U.S. Pat. No. 5,476,535, of which the inventor is one of the joint inventors in the present application. Where the flakes to be produced are of silver, an alloy of the silver with another metal (e.g., aluminum) is first formed, and then the other metal (e.g., aluminum) is leached out to form the porous agglomerate of the silver. Particularly good results have been obtained when the aluminum is leached out while ultrasonic oscillations are applied to enhance penetration of the leaching agent into the pores of the agglomerate.

Further details of this method are set forth in the above-cited U.S. Pat. No. 5,476,535, which patent, including the detailed description therein, is hereby incorporated in its entirety by reference. While particularly good results were obtained when producing the highly porous sponge structure according to the technqiue described in U.S. Pat. No. 5,476,535, it will be appreciated that other methods of producing such a highly porous sponge structure may be used in the method of the present invention.

The invention is particularly useful for producing flat flakes of silver (and its alloys) having high purity. According to another aspect of the present invention, therefore, there is provided a method of making flakes of silver (and its alloys) comprising: (a) producing a highly porous sponge structure of the silver, the structure having a porosity of greater than 30%; (b) comminuting the highly porous sponge structure into particles; and (c) flattening the particles into flakes of silver having a porosity of less than 10%.

Further features, advantages and applications of the invention will be apparent from the description below.

BRIEF DESCRIPTION OF THE DRAWINGS

The invention is herein described, by way of example only, with reference to the preferred embodiment described below and the accompanying drawings, relating to this preferred embodiment wherein:

FIG. 1 is an electronic photograph illustrating the highly porous sponge structure produced in operation (a);

FIG. 2 is an electronic photograph illustrating the comminuted particles produced in operation (b); and FIG. 3 is an electronic photograph illustrating the flakes produced in the flattening operation (c).

PREFERRED EXAMPLE OF THE METHOD

As indicated earlier, the method of the present invention is particularly useful for producing flakes of silver (or its alloys) of high purity. Following is a description of the above-described preferred operations (a), (b), and (c) for accomplishing this.

Operation (a)

A highly porous sponge structure of silver was produced according to the method described in the above-cited U.S. Pat. No. 5,476,535, by forming an alloy of the silver with aluminum, and leaching out the aluminum to form a porous agglomerate of the silver while ultrasonic oscillations were applied to enhance penetration of the leaching agent into the pores of the agglomerate. Further details of the method are set forth in the above-cited U.S. Pat. No. 5,476,535, incorporated herein by reference. The highly porous sponge structure produced during this operation (a) was in the form of agglomerates of silver (or an alloy thereof) having an average size of over 1 mm (up to 2–3 mm diameter), a total internal porosity of about 45%, and an average internal pore size of 25–30 nm. FIG. 1 is an electronic photograph illustrating the sponge agglomerate so produced.

Operation (b)

The sponge agglomerate produced in operation (a) was comminuted into rounded particles by dry milling in an air jet mill. The air jet mill was that supplied by Hosokawa Alpine Aktiengesellschaft, and was operated as follows:

mill pressure—7 bar injection pressure—7.5 bar feed rate—1.5 Kg/H

This operation resulted in rounded "potatoe-shaped" particles having sizes ranging from 0.5 up to 20 microns. The total porosity of these particles was slightly reduced as a result of the compacting forces during milling. FIG. 2 is an electronic photograph illustrating the comminuted particles produced in this operation (b).

The strength of the particles produced in this operation (b) was high enough to withstand the flattening operation (c) described below. However, if the comminuted particles produced in operation (b) are not sufficiently robust for this purpose (e.g., tend to easily disintegrate), they can be strengthened by sintering at elevated temperature in air, vacuum, or liquid. For example, where the process is used for making flat silver flakes, which is the preferred embodiment of the invention described herein, the sintering may be performed in air at a tempereature of 200–500° C., in vacuum at a temperature of 150–300° C., or in a liquid (e.g., a 30% solution of NaOH or KOH) at a temeperature of about 100–120° C.

Operation (c)

In this operation, the comminuted particles produced in operation (b) are flattened into flakes. This operation was performed by wet grinding in a Hosokawa Alpine Annular Ball Mill RSK as follows:

amount of agglomerate—1 Kg amount of water—18 L suspension flow rate—2 L/min rotor speed—2200 rpm Total time—80 minutes This operation (c) resulted in "coin shaped" flakes having a thickness of 1.4–1 microns, a diameter of 2–3 and up to 30–40 microns, and a total porosity of 5–10%. FIG. 3 is an electronic photograph illustrating the flattened silver flakes resulting from this operation (c).

It is to be particularly noted that the wet grinding process of this operation (c) was performed in an aquous medium (water) free of any organic lubricant, surfactant, or other liquid which would be difficult to remove from the silver flakes. As described earlier, this was possible because of the highly porous nature of the metal sponge structure produced in operation (a) and comminuted into particles in operation (b) before being flattening in this operation (c). As a result the so-produced flakes not only had high purity, but also high conductivity because of their freedom from organic residues. It is also to be noted that the milling time (about 80 minutes) was considerably less than the up to 40 hours required in the conventional process for producing flakes as briefly described above.

A further advantage in this process is that the particles used in this flattening operation (c) were not broken down during the flattening operation, so that the size of the flakes can be controlled by controlling the size of the comminuted particles produced in operation (b).

The invention has been described above for producing flakes of silver (or an alloy thereof) since this is presently a preferred application of the invention. It will be appreciated, however, that the invention could be used for producing flakes of other materials, e.g., nickel, gold, platinum, palladium, and their alloys.

Other variations, modifications and applications of the invention will be apparent to those skilled in the art.

What is claimed is:

1. A method of producing metal flakes comprising the following operations:
   (a) producing a highly porous sponge structure of the metal;
   (b) comminuting said highly porous sponge structure into particles; and
   (c) flattening said particles into flakes having a low porosity, said flattening operation being performed in a medium free of an organic lubricant.

2. The method according to claim 1, wherein said operation (a) produces a highly porous sponge structure having a porosity greater than 30%.

3. The method according to claim 1, wherein said operation (a) produces a highly porous sponge structure having a porosity of 40–65%.

4. The method according to claim 1, wherein said medium in which said flattening operation (c) is performed is also free of an organic surfactant.

5. The method according to claim 1, wherein said flattening operation (c) is performed by grinding the particles in an aqueous medium free of an organic lubricant or surfactant.

6. The method according to claim 5, wherein said flattening operation (c) is performed in a ball mill.

7. The method according to claim 1, wherein said comminuting operation (b) comminutes said highly porous sponge structure into particles having an average size of 0.5 to 20 microns.

8. The method according to claim 1, wherein said comminuting operation (b) is performed in an air jet mill which produces rounded particles.

9. The method according to claim 1, wherein said flattening operation (c) produces flakes having a porosity of less than 10%.

10. The method according to claim 1, wherein said flatteing operation (c) produces coin-shaped flakes having a thickness of up to two microns and diameter of up to 40 microns.

11. The method according to claim 1, wherein said highly porous sponge structure produced in operation (a) is in the form of agglomerates having an average size of over one mm, an internal porosity of 40–60%, and an average internal pore size of 20–50 nm.

12. The method according to claim 1, wherein said operation (a) for producing said highly porous sponge structure includes: forming an alloy of the metal with another metal, and leaching out said another metal to form a porous agglomerate of the first-mentioned metal.

13. The method according to claim 12, wherein said another metal is leached out while ultrasonic oscillations are applied to enhance penetration of the leaching agent into the pores of the agglomerate.

14. The method according to claim 1, wherein the comminuted particles produced in operation (b) are subjected to a sintering operation before being flattened in operation (c).

15. The method according to claim 1, wherein said metal is or includes silver.

16. A method of producing flakes of silver comprising performing the following operations:
   (a) producing a highly porous sponge structure of the silver, said structure having a porosity of greater than 30%,
   (b) comminuting said highly porous sponge structure into particles; and
   (c) flattening said particles into flakes of silver having a porosity of less than 10%, said flattening operation being performed in a medium free of an organic lubricant.

17. The method according to claim 16, wherein said medium in which said flattening operation (c) is performed is also free of an organic surfactant.

18. The method according to claim 16, wherein said comminuting operation (b) is performed in an air jet mill which produces rounded particles.

19. The method according to claim 16, wherein said comminuting operation (b) comminutes said highly porous sponge structure into particles having an average size of 0.5 to 20 microns.

20. The method according to claim 19, wherein said highly porous sponge structure produced in operation (a) is in the form of agglomerates having an average size of over one mm, an internal porosity of 40–60%, and an average internal pore size of 20–50 nm.

* * * * *